(12) United States Patent
Morange

(10) Patent No.: US 6,478,076 B1
(45) Date of Patent: Nov. 12, 2002

(54) MECHANICAL ASSEMBLY FOR FABRICATING AN ALLOY FILM ON A FACE OF A HEAT EXCHANGER FOR AN INTEGRATED CIRCUIT

(75) Inventor: Blanquita Ortega Morange, Poway, CA (US)

(73) Assignee: Unisys Corporation, Blue Bell, PA (US)

( * ) Notice: Subject to any disclaimer, the term of this patent is extended or adjusted under 35 U.S.C. 154(b) by 0 days.

(21) Appl. No.: 09/912,842

(22) Filed: Jul. 24, 2001

(51) Int. Cl.[7] .............................. F28F 7/00; F28F 19/02
(52) U.S. Cl. ..................................... 165/80.4; 165/133
(58) Field of Search ................... 165/185, 80.4, 165/133, 46; 118/406, 504, 505

(56) References Cited

U.S. PATENT DOCUMENTS 3,589,704 A * 6/1971 Kurtz ........................ 269/67
3,953,013 A * 4/1976 Griffith et al. ................ 269/7
4,209,059 A * 6/1980 Anthony et al. ............. 165/133
4,879,632 A * 11/1989 Yamamoto et al. .......... 165/185
5,582,242 A * 12/1996 Hamburgen et al. ... 165/104.21
6,179,047 B1 * 1/2001 Tustaniwskyj et al. .... 165/80.4

FOREIGN PATENT DOCUMENTS

JP            59081495       * 5/1984

* cited by examiner

Primary Examiner—Henry Bennett
Assistant Examiner—Tho Var Duong
(74) Attorney, Agent, or Firm—Charles J. Fassbender; Mark T. Starr; Lise A. Rode (57) ABSTRACT

A mechanical assembly is comprised of a heat exchanger for an integrated circuit. In the assembly, a retainer for a liquid has a bottom with an opening thru which the heat exchanger extends such that a face of the heat exchanger is surrounded by the retainer. Also in the assembly, a compliant member forms a seal for the liquid between the heat exchanger and the retainer. This mechanical assembly is useful in fabricating an alloy film on the heat exchanger's face.

14 Claims, 5 Drawing Sheets

TIME (SECONDS) — PASSAGEWAY — SPILLAGE

| | | | | | |
|---|---|---|---|---|---|
| S1 → | Assemble components per Fig. 3 | 30 | | | |
| S2 → | Dispense Flux on face | 4 | 12d | — | YES |
| S3 → | Pick & Place Alloy on face | 5 | 12d | — | NO |
| S4 → | Spread alloy over face | 6 | 12d | — | NO |
| S5 → | Dispense flux on alloy | 5 | 12d | — | YES |
| S6 → | Smooth alloy over face | 6 | 12d | — | NO |
| S7 → | Pre-wash face | 2 | 12f | — | YES |
| S8 → | Smooth alloy over face | 4 | | — | NO |
| S9 → | Pause | 5 | | — | NO |
| S10 → | Wash/Rinse face | 20 | 12f,12e | — | YES |
| S11 → | Dry | 20 | 12d | — | YES |

FIG. 4B

TIME (SECONDS) — PASSAGEWAY — SPILLAGE

| | | | | | |
|---|---|---|---|---|---|
| S21 → | Assemble components per Fig. 3 | 30 | | | |
| S22 → | Melt & remove alloy on face | 5 | 12d | — | YES |
| S23 → | Dispense water on face & scrub | 4 | 12d | — | YES |
| S24 → | Aspirate with water on face | 7 | 12d | — | YES |
| S25 → | Dispense flux on face | 4 | 12d | — | YES |
| S26 → | Pick & place alloy on face | 5 | 12d | — | NO |
| S27 → | Spread alloy on face | 7 | 12d | — | YES |
| S28 → | Aspirate with water on face | 5 | 12d | — | YES |
| S29 → | Pre-wash face | 6 | 12f | — | YES |
| S30 → | Wash/Rinse face | 15 | 12f,12e | — | YES |
| S31 → | Dry | 20 | 12d | — | YES |

MECHANICAL ASSEMBLY FOR FABRICATING AN ALLOY FILM ON A FACE OF A HEAT EXCHANGER FOR AN INTEGRATED CIRCUIT

RELATED CASE

The present invention, as identified by the above title and docket number, is related to another invention which is identified as follows: "METHOD OF FABRICATING AN ALLOY FILM ON A FACE OF A BEAT EXCHANGER FOR AN INTEGRATED CIRCUIT" having U.S. Ser. No. 09/912,836. Patent Applications on both of these inventions were filed concurrently on Jul. 24, 2001, and they have one common Detailed Description.

BACKGROUND OF THE INVENTION

This invention relates to heat exchangers which regulate the temperature of an integrated circuit via thermal conduction by pressing against the integrated circuit. More particularly, this invention relates to methods and apparatus for use in fabricating a particular type of the above heat exchanger which has a face with an alloy film that presses against the integrated circuit.

In the prior art, U.S. Pat. No. 6,243,944 (hereafter patent '944) describes an array of several heat exchangers that are held by a frame in alignment with a corresponding array of integrated circuits on a printed circuit board, and each heat exchanger has a face with an alloy film that presses against a respective one of the integrated circuits. See, for example, FIG. 1 in patent '944 wherein each item 23 is one integrated circuit, and each item 15 is one heat exchanger. See also FIG. 6 in patent '944 wherein item 15a is the face of one heat exchanger that presses against an integrated circuit, and item 15b is an alloy film on the face 15a.

By providing the alloy film 15b on face 15a of the heat exchanger, the thermal resistance between that face and the integrated circuit is greatly decreased. The alloy film affects the thermal resistance because the face of the heat exchanger, and the surface of the integrated circuit which that face presses against, are not perfectly smooth; and consequently, an irregular shaped microscopic gap exists between the face of the heat exchanger and the integrated circuit. But, when the alloy film on the face of the heat exchanger is melted, the alloy substantially fills the gap; and that causes the thermal resistance to decrease. This is shown in FIGS. 7 and 8 of patent '944.

The above concept for reducing thermal resistance applies to heat exchangers which have a wide variety of shapes and sizes, and which are held in an array by a wide variety of frames. For example, see U.S. Pat. No. 6,179,047 (hereafter patent '047) wherein FIG. 1 shows a frame 10 that holds multiple heat exchangers 20 in an array, and each heat exchanger has a face 21 on which an alloy film can be provided. See also, FIG. 10 of patent '047 which shows another heat exchanger 90 that can be held in an array by the frame 10, and this heat exchanger 90 has a face 91 on which an alloy film can be provided.

However, one problem with the above concept for reducing thermal resistance is how to refurbish the alloy film on the face of the heat exchangers after they have made contact with multiple integrated circuits. This refurbishment is occasionally needed when an array of heat exchangers are held by a frame and are used in equipment which tests many integrated circuits in a sequential fashion. There, when the test on one array of integrated circuits is complete, the heat exchangers are moved to another array of integrated circuits. After about one-thousand to three-thousand arrays of the integrated circuits have been tested, the alloy film on the face of the heat exchangers needs to be refurbished because the alloy film oxidizes and that changes its thermal characteristics.

If the alloy film is refurbished on the face of the heat exchangers while they are held by the frame, then various components which couple the heat exchanger to the frame can become contaminated by various fluids used in the refurbishment process. For example, FIG. 2 of patent '944 shows that to fabricate the alloy film, a flux must first be spread on the face of the heat exchanger. This flux promotes metallurgical bonding between the face of the heat exchanger and the metal alloy which is subsequently applied as shown in FIGS. 3 and 4. However, if a portion of the flux drips off the face of the heat exchanger, that flux could corrode other components such as the coil springs 20 in FIG. 1 of patent '944, the leaf springs 30a–30d in FIG. 1 of patent '047, and the leaf spring 80 in FIG. 10 of patent '047.

Alternatively, all of the heat exchangers can be removed from the frame before the alloy film is refurbished; and then all of the heat exchangers can be re-attached to the frame. However, the removing step and re-attaching step are time-consuming; and that adds to the cost of the refurbished process.

Also, another problem with the above concept for reducing thermal resistance is how to fabricate the alloy film such that it has a thickness which lies within a narrow preferred range. If the alloy film is too thin, then the irregular-shaped microscopic gap between the integrated circuit and the face of the heat exchanger will not be filled with alloy; and, that will increase the thermal resistance. Conversely, if the alloy film is too thick, then a portion of the alloy could get squeezed off of the heat exchange when the face of the heat exchanger is pressed against the integrated circuit; and that could cause a short-circuit in the test equipment. One preferred range for the thickness of the alloy where it is neither too thick or too thin is 75 $\mu$m–100 $\mu$m.

In FIG. 3 of patent '044, the thickness of the alloy film is controlled by placing a solid piece of alloy, of predetermined size, on the face of the heat exchanger; melting that alloy; and spreading the melted alloy to form the film. However, the alloy in FIG. 3 of patent '044 will form a film on the heat exchanger at all locations which are coated with flux. Thus, if some of the flux in FIG. 2 of patent '044 drips off of the face onto an adjacent region on the side of the heat exchanger, then that region will also be coated with the alloy film. Consequently, the thickness of the alloy film on the face of the heat exchanger will not be in the predetermined range.

Accordingly, a primary object of the present invention is to provide a method and apparatus for solving the above problems.

BRIEF SUMMARY OF THE INVENTION

The present invention, as claimed herein, is a mechanical assembly that is useful in fabricating an alloy film on a face of a heat exchanger for an integrated circuit. This mechanical assembly is comprised of: 1) the above heat exchanger on which the alloy film is to be fabricated, 2) a retainer for a liquid which has a bottom with an opening thru which the heat exchanger extends such that the retainer surrounds the heat exchanger's face; and, 3) a compliant member, in the opening of the bottom of the retainer around the heat exchanger, which forms a seal for the liquid between the heat exchanger and the retainer.

Using the above assembly, the alloy film is fabricated by dispensing various liquids (such as a liquid flux, liquid alloy, and water) on the heat exchanger's face in a sequence; and as that occurs, at least a portion of the liquids fall off of the heat exchanger's face into the retainer. But, the compliant member prevents the liquids that fall into the retainer from leaking onto any other components which hold the heat exchanger on a frame.

Also in one embodiment, the seal around the heat exchanger is adjacent to the heat exchanger's face. That enables the alloy film to be fabricated with a precisely controlled thickness on the heat exchanger's face because no liquid flux and no liquid alloy can inadvertently drip onto any region of the heat exchanger adjacent to its face.

DETAILED DESCRIPTION

Figure 1:
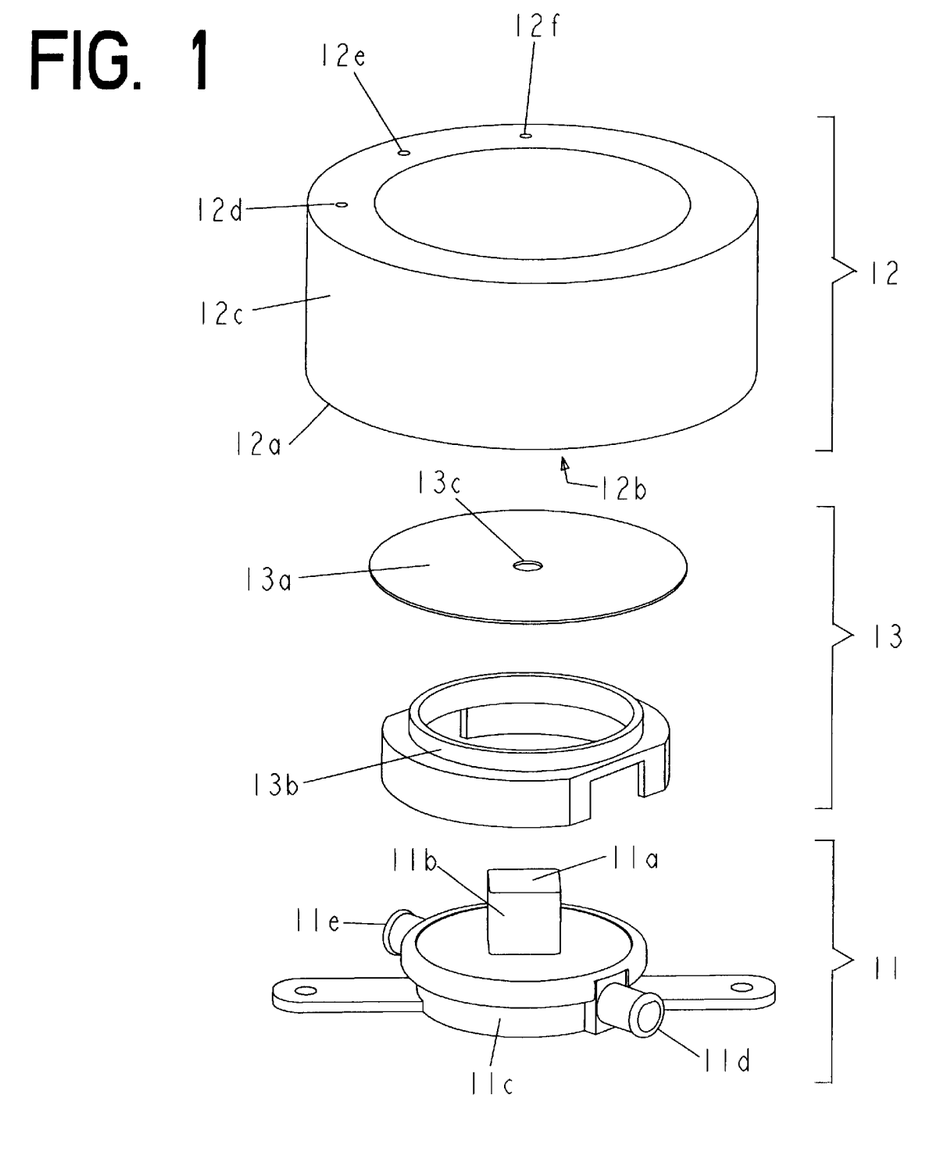
FIG. 1 is an exploded view of a mechanical assembly for fabricating an alloy film, in accordance with the present invention, on a face of a heat exchanger for an integrated circuit.
Figure 2:
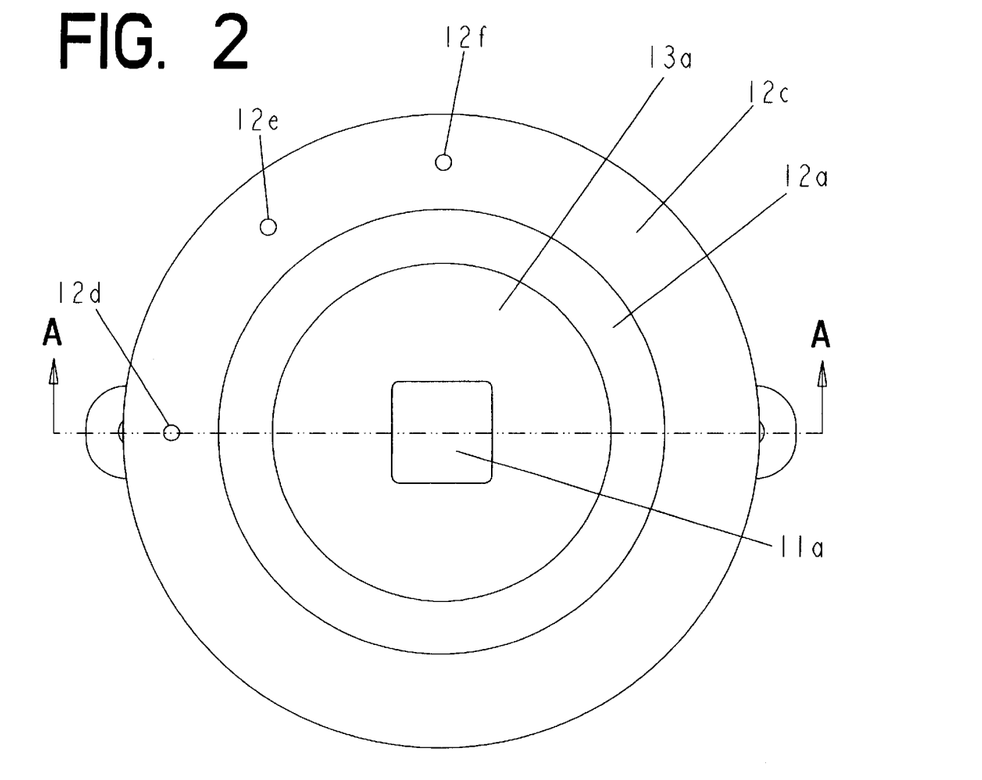
FIG. 2 is a top view of the mechanical assembly of FIG. 1.
Figure 3:
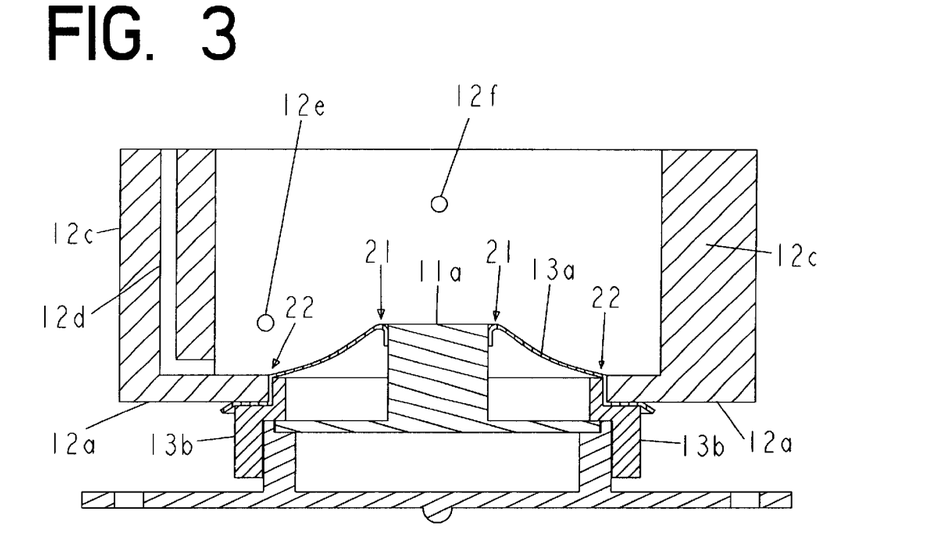
FIG. 3 is a sectional view of the mechanical assembly in FIGS. 1 and 2, taken along line A in FIG. 2.

Referring now to FIGS. 1, 2 and 3, a novel mechanical assembly, which is one preferred embodiment of the present invention, will be described in detail. Later, in conjunction with FIGS. 4A and 4B, a novel process will be described in detail which uses the above mechanical assembly in accordance with the present invention to fabricate an alloy film on the face of a heat exchanger for an integrated circuit chip.

In FIG. 1, component 11 is a heat exchanger which has a face 11a for pressing against an integrated circuit chip. This face 11a is on a pedestal 11b which extends from a hollow body 11c. The hollow body 11c has an input port lid and an output port 11e so that a fluid can be forced thru the hollow body when the face 11a is pressing against the integrated circuit chip. This heat exchanger 11 exists in the prior art, and it is shown in FIG. 10 of patent '047 (as cited in the BACKGROUND).

Also in FIG. 1, component 12 is a retainer for various liquids that are used to fabricate the alloy film on face 11a of the heat exchanger 11. This retainer 12 has a bottom 12a with an opening 12b; and, the pedestal 11b on the heat exchanger 11 extends into the opening 12b. In that position, the heat exchanger face 11a is surrounded by a sidewall 12c of the retainer 12. The sidewall 12c also has three hollow passageways 12d, 12e and 12f; and their function will be described later in conjunction with the process of FIGS. 4A and 4B.

Further in FIG. 1, component 13 is a compliant member which forms a seal between the heat exchanger 11 and the retainer 12. Due to that seal, the retainer 12 will hold various liquids that are used in the process of FIGS. 4A and 4B to fabricate the alloy film on face 11a of the heat exchanger 11. That is important because it enables the alloy film to be fabricated on the face 11a while the heat exchanger 11 is held by a frame, without contaminating any parts that couple the heat exchanger to the frame.

Figure 9:
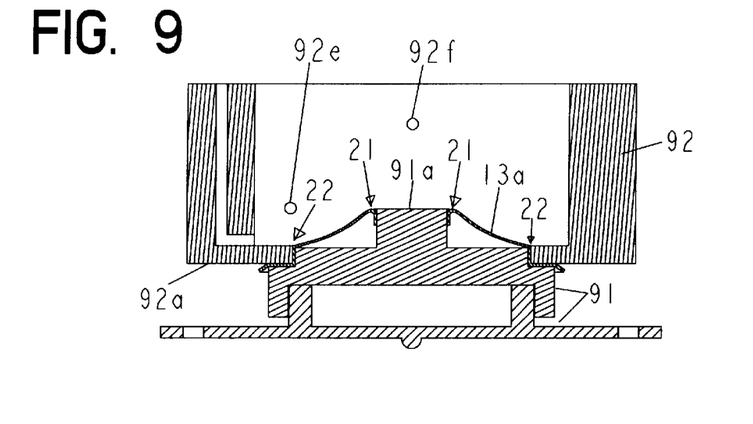
Figure 10:
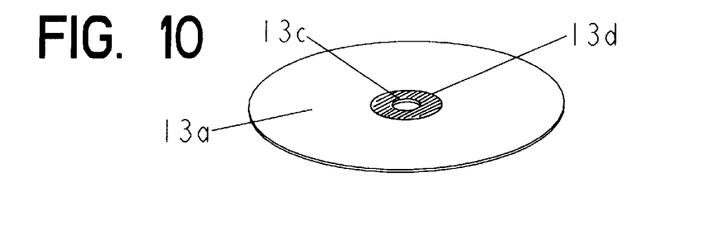

A prior art example of how the heat exchanger 11 can be held by a frame is shown in FIG. 10 of patent '047. There, the heat exchanger is identified by reference numeral 90; the frame is identified by reference numeral 70; and the heat exchanger is coupled to the frame by a pair of stops 100 and a spring 80. Also, several copies of the FIG. 10 structure can be attached, by screws, in an array onto a larger frame, such as the frame 10 or the frame 10' that are respectively shown in FIG. 1 and FIG. 9 of patent '047.

In FIG. 1 of the present invention, the compliant member 13 consists of a thin stretchy membrane 13a and a ring-shaped attaching part 13b. This membrane 13a extends across the opening 12b on the bottom of the retainer 12, and the ring-shaped attaching part 13b fits snugly into the opening 12b. Consequently, the ring-shaped attaching part 13b holds the membrane 13a on the retainer 12 by squeezing the perimeter of the membrane 13a against the retainer 12 around the opening 12b.

Located in the center of the membrane 13a is a hole 13c; and it has a perimeter which stretches around the face 11a of the heat exchanger 11. Due to this stretchy structure, a seal is formed which exposes the heat exchanger's face 11a and exposes no portion of the pedestal 11b which lies adjacent to the face 11a. Consequently, no liquids which are used to fabricate the alloy film on the face 11a will spill onto an adjacent portion of the pedestal 11b. That is important because it enables the alloy film to be fabricated with a preferred thickness and small tolerances.

When the components 11, 12 and 13 of FIG. 1 are coupled together, they form the assembly that is shown in FIGS. 2 and 3. In that assembly, all of the components and their physical features are identified by the same reference numerals that they have in FIG. 1.

Also in the assembly of FIGS. 2 and 3, reference numeral 21 identifies the seal which the thin stretchy membrane 13a makes with the heat exchanger 11 around the face 11a. Similarly in FIG. 3, reference numeral 22 identifies the seal which the thin stretchy membrane 13a and the ring-shaped attaching part 13b make with the heat exchanger 11 around the opening in the retainer bottom 12a.

One feature of the assembly in FIGS. 2 and 3 is that the seals 21 and 22 are easily made and are easily undone. To make the seal 21, the pedestal 11b is simply pushed thru the hole 13c in the stretchy membrane 13a. To make the seal 22, the perimeter of the stretchy membrane 13a is simply squeezed between the retainer bottom 12a and the ring-shaped part 13b.

Consequently, when a plurality of the heat exchangers 11 are held in an array by a frame, then the assembly of FIGS. 2 and 3 can be easily formed with each heat exchanger in a sequential fashion. This is achieved simply by moving the retainer 12 and the compliant member 13 from one heat exchanger to another. Each time the assembly of FIGS. 2 and 3 is formed with one particular heat exchanger, the process steps of FIGS. 4A and 4B can be performed to form an alloy film on the face 11a of that heat exchanger.

Another feature of the assembly in FIGS. 2 and 3 is that the seal 21 will form around the heat exchanger face 11a, even when the face 11a is changed in size and shape over a wide range. This feature occurs because the membrane 13a will stretch to accommodate various sizes and shapes for the face 11a and the pedestal 11b. Consequently, the assembly of FIGS. 2 and 3 can be formed with several different heat exchangers, and a separate membrane 13a does not need to be tailored for each heat exchanger.

Now, with reference to FIG. 4A, one preferred process will be described which uses the mechanical assembly of FIGS. 1, 2 and 3 to fabricate an alloy film on the heat exchanger's face 11a. This process is performed by a sequence of steps which are listed as steps S1–S11 in FIG. 4A. Each of the steps S1–S11 can be performed either manually by a workman or automatically by a machine.

Associated with each of the steps S1–S11 is a "TIME" parameter, a "PASSAGEWAY" parameter, and a "SPILLAGE" parameter. The "TIME" parameter specifies how long, in seconds, the step is performed. The "PASSAGEWAY" parameter identifies each passageway 12d, 12e, or 12f that is used to pass a fluid while the step is performed. And, the "SPILLAGE" parameter indicates whether or not any fluid spills from the heat exchanger's face 11a into the retainer 12 while the step is performed.

The purpose of the passageway 12f is to put water into the retainer 12 to wash the heat exchanger face 11a. The purpose of the passageway 12e is to remove any fluid, and any debris in the fluid, from the retainer 12 but only up to the level of the heat exchanger's face 11a. The purpose of the passageway 12d is to remove any fluid, and any debris in the fluid, in their entirety, from the retainer 12.

Removal of fluid and debris thru the passageways 12d and 12e occurs by applying a vacuum to those passageways. Fluid and debris is removed in its entirety thru the passageway 12d because the elastic membrane 13a slopes down and away from the heat exchanger's face 11a, and the passageway 12d starts at the lowest point inside the retainer 12. By comparison, the passageway 12e starts at a point within the retainer 12 that is level with the heat exchanger's face 11a.

Figure 4A:
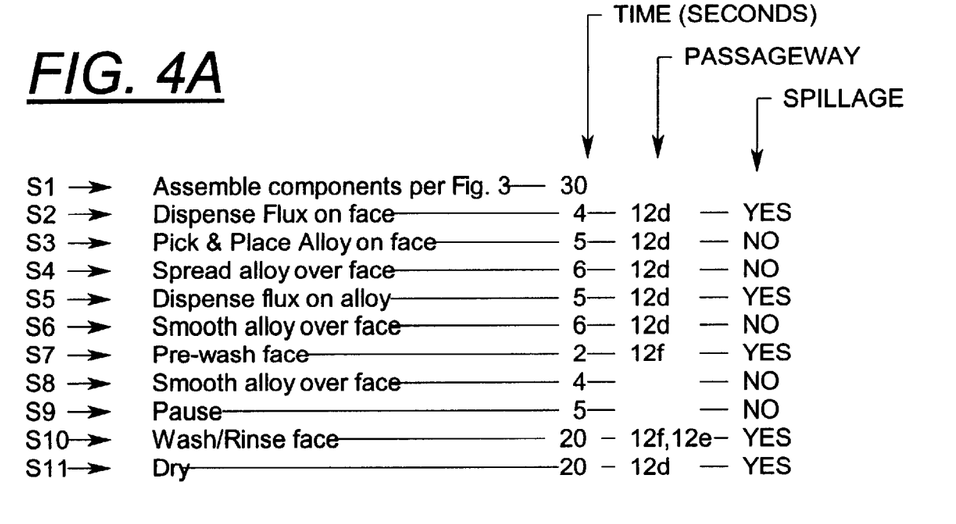
FIG. 4A lists the steps of a process which fabricates an alloy film, in accordance with the present invention, on the face of the heat exchanger that is in the assembly of FIGS. 1–3.

In step S1 of FIG. 4A, the assembly of FIG. 3 is formed. To do that, the stretchy membrane 13a is first placed on the heat exchanger pedestal 11b such that the seal 21 is formed around face 11a. Next, the perimeter of the stretchy membrane 13a is draped over the ring-shaped attaching part 13b. Then, the retainer 12 is pushed onto the ring-shaped attaching part 13b such that the perimeter of the stretchy membrane 13a is squeezed between the ring-shaped part 13b and the retainer 12. This step S1 takes only about thirty seconds to complete.

In step S2, a liquid flux is dispensed on the heat exchanger's face 11a. This flux is any chemical that will promote metallurgical bonding between the heat exchanger's face 11a and the alloy film which is to be fabricated on that face. For example, once such flux is a mixture of 70%–80% alcohol, 15%–25% carboxylic acid, and 10%–20% amine hydrochloride.

In step S3, a solid piece of alloy, of a predetermined size, is picked-up and placed on the heat exchanger's face 11a. The size of this solid piece of alloy is selected such that after the alloy is melted and spread uniformly across the heat exchanger's face 11a, it will have a preferred thickness. One such thickness is 75 $\mu$m–100 $\mu$m.

In step S4, the alloy from step S3 is melted and spread across the heat exchanger's face 11. This can be done, for example, by using a tool with a hot tip that melts the alloy. With this step, the main object is simply to cover the entire face 11a with alloy, and the thickness of the alloy need not be uniform.

In step S5, additional liquid flux is dispensed onto the alloy on the heat exchanger's face 11a. Preferably this flux has a diluted concentration. If the flux is not diluted, then the alloy layer from step S4 might de-wet from face 11a, and the case which the alloy spreads uniformly in step S6 will decrease.

In step S6, the alloy film that was formed in step S4 is spread into a smooth and uniformly thick film. Here again, the spreading can be done by using a tool with a hot tip that melts the alloy.

In step S7, water is sent thru the passageway 12f into the retainer 12. This water flows until the water level in the retainer 12 is approximately one-eighth inch above the heat exchanger's face 11a. The total mount of water which is sent into the retainer 12 is controlled by the flow rate of the water and the time duration of step S7. By this step, a preliminary cleaning of the face 11a occurs.

In step S8, any bumps or similar imperfections in the alloy film on face 11a are made smooth. This is achieved by touching the bumps, and/or smoothing the bumps, with the hot tip of a tool. During this step, the water in retainer 12 remains at the level which is set in step S7.

In step S9, only a pause occurs. This ensures that any remaining flux and flux residue dissolves with the water that was put into the retainer 12 in step S7. Also during this pause, any small bumps or dimples in the alloy film can be touched-up with the hot tip of a tool before steps S10 and S11 are performed.

In step S10, the alloy film on the heat exchanger's face 11a is thoroughly washed and rinsed. This is achieved by sending water thru the passageway 12f into the retainer 12, while concurrently removing that water together with any residue debris thru the passageway 12e.

Lastly, in step S11 the retainer 12 is completely depleted of any water and residue debris, and the retainer 12 along with the heat exchanger's face 11a is dried. This is achieved by applying a vacuum to the passageway 12d.

Inspection of the "SPILLAGE" parameters in FIG. 4A shows that during steps S2, S5, S7, and S10–S11, either flux or water can spill off of the heat exchanger's face 11a. However, due to the operation of the retainer 12 and the compliant member 13, none of that spillage will contaminate or otherwise damage any parts that couple the heat exchanger 11 to the frame. Prior art examples of these parts and the frame are shown in the previously cited FIGS. 1, 9 and 10 of patent '047.

Also, due to the seal 21 that is formed by the compliant member 13, only the heat exchanger's face 11a and no adjacent portion of the heat exchanger's pedestal 11b is exposed to the flux and the alloy and the water that is used by the process of FIG. 4A. Further, by carefully spreading and smoothing the alloy in steps S4, S6 and S8, all of the alloy which is dispensed in step S3 will remain on the heat exchanger's face 11a. Due to these two points, the alloy film which is fabricated on the heat exchanger's face has a precisely controlled thickness.

After the alloy film has been fabricated on the heat exchanger's face 11a by the process of FIG. 4A, the heat exchanger 11 is ready to be used in test equipment which tests integrated circuit chips in a sequential fashion. Each time one integrated circuit chip is tested, the heat exchanger's face and the integrated circuit chip are pressed together, and the alloy film melts to thereby fill microscopic gaps between the heat exchanger's face 11a and the integrated circuit chip. However, when the alloy film is used in such equipment, the alloy film slowly oxidizes; and, after about one-thousand to three thousand cycles, the alloy film on the heat exchanger's face 11a needs to be refurbished.

Figure 4B:
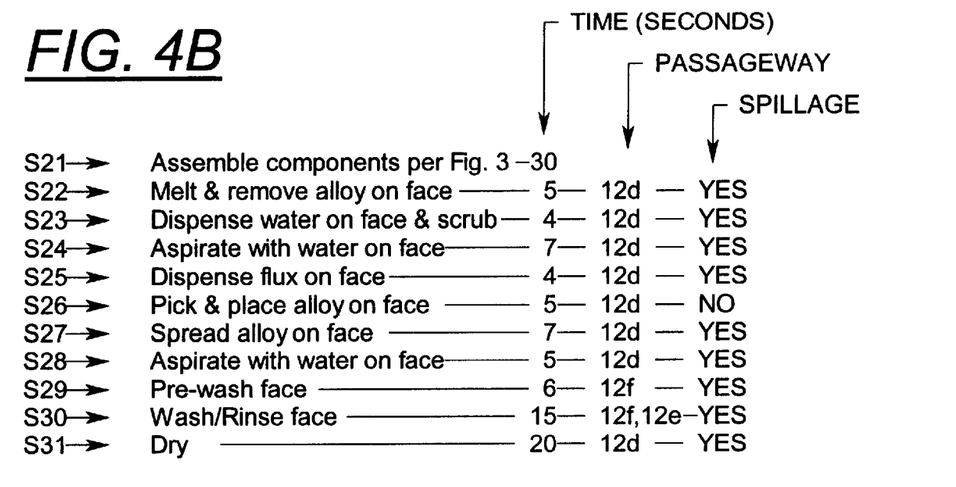
FIG. 4B lists the steps of a process which precedes the process of FIG. 4A to refurbish an alloy film on the face of the heat exchanger that is in the assembly of FIGS. 1–3.

This refurbishment is done, in accordance with the present invention, by performing steps S21–S31 of FIG. 4B, followed by steps S2–S11 of FIG. 4A. The FIG. 4B process begins with step S21 wherein the assembly of FIG. 3 is formed, as was previously described in conjunction with step S1.

In step S22, the alloy layer which was previously put on the heat exchanger's face 11a and which is now at least partially oxidized, is melted and removed. This removal is achieved by dispensing water on the heat exchanger's face while concurrently using an aspirator to suck a mixture of the melted alloy and the water from the heat exchanger's face. Any excess mixture is removed from the retainer 12 thru the passageway 12d.

In steps S23 and S24, various inter-metallic compounds and oxidized alloy and residue, which forms on the heat exchanger's face 11a, are removed. This is achieved by first scrubbing the heat exchanger's face with water, in step S23. Then in step S24, a mixture of the scrubbed-off inter-metallics and oxidized alloy and residue and water is removed with an aspirator. Again, any excess mixture is removed from the retainer 12 thru the passageway 12d.

In steps S25–S28, any oxidized metal in the heat exchanger's face 11a is removed, and then the heat exchanger's face 11a is covered with a thin coat of the alloy. This is achieved by first performing step S25 wherein flux is dispensed on the heat exchanger's face 11a. Next in step S26, a small amount of alloy is put on the heat exchanger's face and melted Then in step S27, the melted alloy is spread into a non-uniform thin coat across the heat exchanger's face 11a. Lastly, in step S28, water is dispensed on the alloy coating; and a mixture of that water and alloy and any residual materials on the alloy re removed with an aspirator. This leaves a thin alloy film on the heat exchanger's face 11a which is only about one-tenth as thick as the film which is formed by the process of FIG. 4A.

In steps S29–S31, the thin coat of alloy on the heat exchanger's face 11a is completely cleaned and dried. Step S29 is performed just like step S7 in FIG. 4A; step S30 is performed just like step S10 in FIG. 4A; and step S31 is performed just like step S11 in FIG. 4A.

Inspection of the "SPILLAGE" parameters in FIG. 4B shows that during steps S22–S25 and S27–S31, either flux or alloy or water can spill off of the heat exchanger's face 11a. However, due to the operation of the retainer 12 and the compliant member 13, none of that spillage will contaminate or otherwise damage any parts that couple the heat exchanger 11 to the frame.

One preferred embodiment of a novel mechanical assembly, which is structured in accordance with the present invention, has now been described in detail. Also, one preferred process which fabricates and refurbishes an alloy film on the face of the heat exchanger, in accordance with the present invention, has now been described in detail. However, various modifications can be made to the above details without departing from the scope of the invention; and, some examples of such modifications will now be described in conjunction with FIGS. 5–12.

Figure 5:
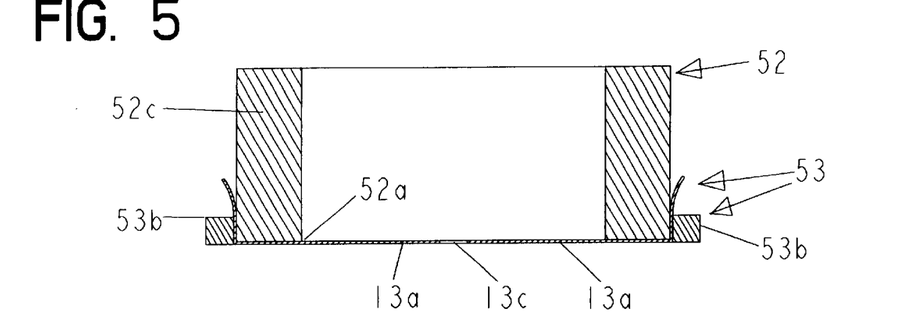
FIGS. 5–12 each show one respective modification to the assembly of FIGS. 1–3.

In FIG. 5, reference numeral 52 identifies a retainer which is a modified version of the retainer 12 in FIGS. 1–3. Here, the only modification is that the bottom 52a of the retainer does not extend inward past the sidewall 52c of the retainer, as it does in FIGS. 1–3. Also in FIG. 5, reference numeral 53 identifies a compliant member which is a modified version of the compliant member 13 in FIGS. 1–3. This compliant member 53 includes the thin stretchy membrane 13a with its hole 13c as shown in FIGS. 1–3. Also, the compliant member 53 includes a ring-shaped attaching part 53b which squeezes the perimeter of the stretchy membrane 13a against the exterior surface of the retainer's sidewall 52c.

Figure 6:
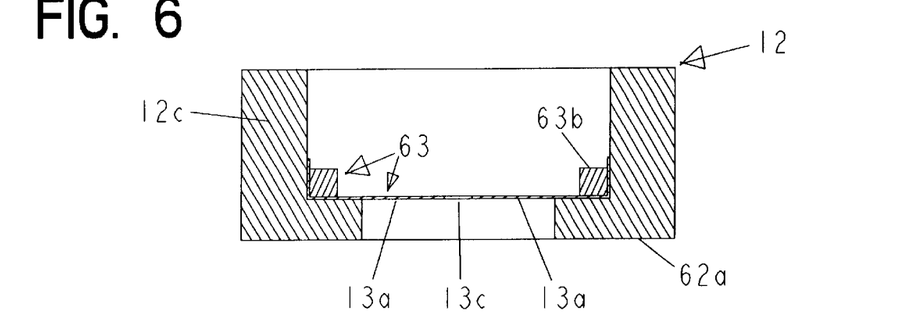

In FIG. 6, reference numeral 12 identifies the retainer 12 from FIGS. 1–3; and, reference numeral 63 identifies a compliant member which is a modified version of the compliant member 13 in FIGS. 1–3. This compliant member 63 includes the thin stretchy membrane 13a with its hole 13c from FIGS. 1–3. Also, the compliant member 63 includes a ring-shaped attaching part 63b which squeezes the perimeter of the stretchy membrane 13a against the interior surface of the retainer's sidewall 12c.

Figure 7:
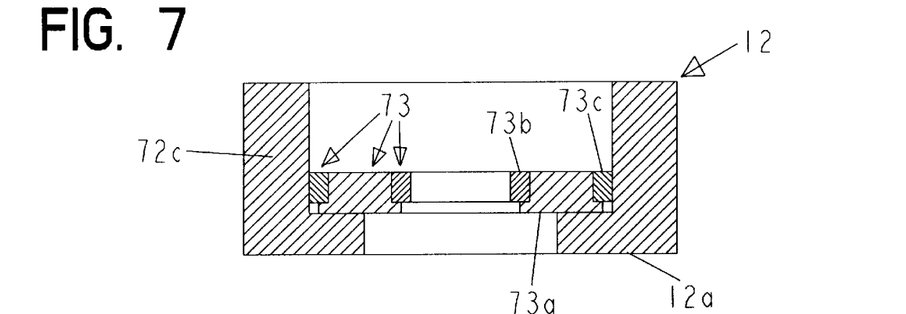

In FIG. 7, reference numeral 12 identifies the retainer 12 from FIGS. 1–3; and, reference numeral 73 identifies a compliant member which is a modified version of the compliant member 13 in FIGS. 1–3. This compliant member 73 includes a rigid ring-shaped part 73a which has an inner sidewall that holds a seal ring 73b, and which has an outer sidewall that holds a seal ring 73c. The seal ring 73b has a shape which surrounds the pedestal 11b of the heat exchanger 11 in FIG. 1 and forms a seal adjacent to the heat exchanger's face 11a. The seal ring 73c has a shape which fits into the retainer 12 and forms a seal with the interior of the retainer's sidewall 12c.

Figure 8:
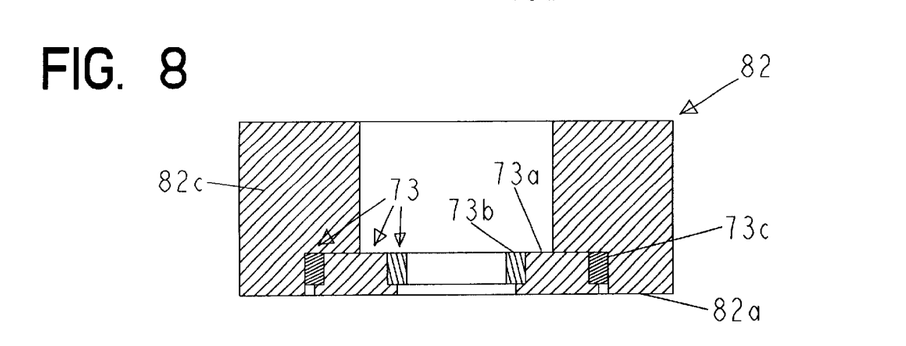

In FIG. 8, reference numeral 82 identifies a retainer which is a modified version of the retainer 12 in FIGS. 1–3; and reference numeral 73 identifies the compliant member 73 from FIG. 7. The modification which is in the retainer 82 is that the retainer's bottom 82a has a notch into which the compliant member 73 snugly fits as shown; and the seal ring 73c forms a seal in that notch.

In FIG. 9, an assembly is shown which is similar to the assembly of FIGS. 1–3 but in which the ring-shaped attachment part 13b is eliminated. To accomplish that, the assembly of FIG. 9 includes a heat exchanger 91 and a retainer 92 that has a bottom surface 92a with an opening into which the heat exchanger snugly fits. The FIG. 9 assembly also includes the thin stretchy membrane 13a of FIGS. 1–3, and that membrane is squeezed against the retainer 92 by the heat exchanger 91, as shown, to form the seal 22. The thin stretchy membrane 13a also forms the other seal 21 around the heat exchanger's face 91a, just like it does in FIGS. 1–3.

In FIG. 10, a modification is shown to the previously described thin stretchy membrane 13a of FIG. 1. Here, the modification is that a layer of sticky material 13d is attached to a portion of the membrane 13a which is adjacent to the hole 13c. When this modification is incorporated into the assemblies of FIGS. 1–3, 5, 6 and 9, the sticky material 13d contacts the pedestal 11b of the heat exchanger 11 around the heat exchanger's face 11a, and that enhances the seal 21. One specific example of a suitably sticky material 13d is double-sided silicone tape.

Figure 11:
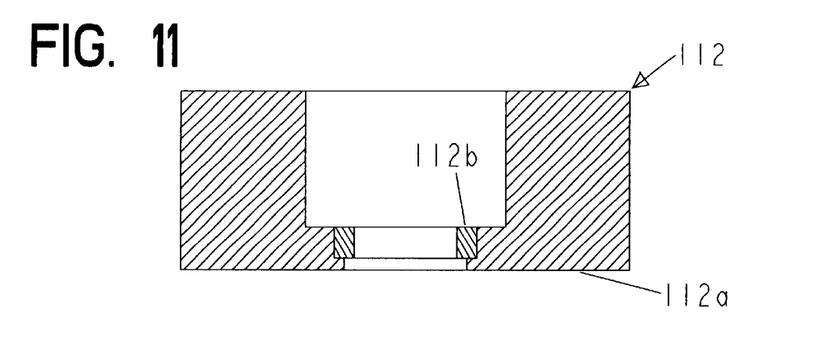

In FIG. 11, an assembly is shown which is similar to the assembly of FIG. 8 but in which the ring-shaped part 73a and the seal ring 73c are eliminated. To accomplish that, the assembly of FIG. 11 includes a retainer 112 that has a bottom 112a with an opening that is slightly larger than the face 11a of the heat exchanger 11 in FIG. 1. A seal ring 112b is held by the bottom of the retainer 112, and that seal ring presses against the pedestal 11b of the heat exchanger 11 of FIG. 1 to thereby form the seal 21.

Figure 12:
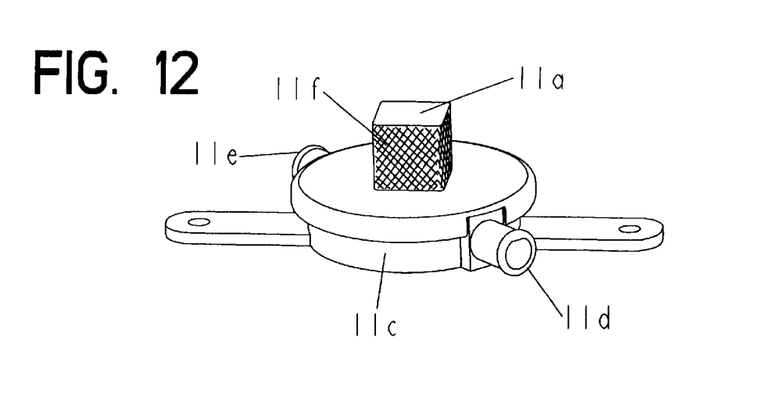

In FIG. 12, a modification is shown to the heat exchanger 11 of FIG. 1. Here, the modification is that the pedestal of the heat exchanger 11 is coated with a material 11f which will not wet the alloy that is fabricated on the heat exchanger's face 11a by the process of FIG. 4A. Examples of the material 11f are: 1) a Teflon coating, 2) a silicone coating, and 3) Teflon tape with a silicone adhesive. With this modification, the seal 21, as shown in FIG. 3, can occur anywhere on the heat exchanger's pedestal and need not be made adjacent to the heat exchanger's face 11a.

All of the above assemblies of FIGS. 5–12 can be used in the process of FIGS. 4A and 4B. Also, various steps in the process of FIGS. 4A and 4B can be modified. For example, the liquids that are used in process of FIGS. 4A and 4B can be drained by gravity from the retainer 12, rather than be sucked by a vacuum thru the passageway 12d and 12c. To implement this modification, the passageways 12d and 12e need to extend from the inside of the retainer 12 in a downward direction to the outside of the retainer 12. Tubes can connect to those passageways and drain the fluid away from the frame on which the heat exchangers are held.

Accordingly, it is to be understood that the scope of the present invention is not limited to details of any one particular assembly or process that is shown in the FIGS. 1–12, but is defined by the appended claims.

What is claimed is:

1. A mechanical assembly which is comprised of:
   a integrated circuit heat exchanger which has a face that is flat and finless;
   a retainer for a liquid which has—a) an open top, b) a bottom with an opening thru which said face of said integrated circuit heat exchanger extends such that said retainer surrounds said face, and c) a sidewall that extends from said top to said bottom and includes a passageway with an opening inside of said retainer between said bottom and said face; and,
   a compliant member which—a) is separate from said integrated circuit heat exchanger, b) is in said opening around said integrated circuit heat exchanger, which forms a seal for said liquid between said integrated circuit heat exchanger and said retainer that is separately removeable and reusable.

2. A mechanical assembly according to claim 1 wherein said compliant member includes a) a stretchy membrane which extends across said opening and has a hole with a perimeter that stretches around said face to form said seal with said heat exchanger, and b) an attaching part which holds said stretchy membrane on said retainer.

3. A mechanical assembly according to claim 2 wherein said attaching part is ring-shaped, fits into said opening, and squeezes said membrane against a sidewall of said opening.

4. A mechanical assembly according to claim 2 wherein said attaching part is ring-shaped, fits around said retainer, and squeezes said membrane against an exterior surface of said retainer.

5. A mechanical assembly according to claim 2 wherein said attaching part is ring-shaped, fits inside of said retainer, and squeezes said membrane against an interior surface of said retainer.

6. A mechanical assembly according to claim 1 wherein said compliant member includes a ring-shaped member with a) an inner sidewall which holds a first seal ring that surrounds and forms a seal with said heat exchanger, and b) an outer sidewall which holds a second seal ring that forms a seal with said retainer which encompasses said opening.

7. A mechanical assembly according to claim 6 wherein said ring-shaped member fits inside of said retainer, and said second seal ring presses against an interior surface of said retainer which encompasses said opening.

8. A mechanical assembly according to claim 6 wherein said ring-shaped member fits into said opening in said bottom of said retainer, and said second seal ring presses against said retainer around the perimeter of said opening.

9. A mechanical assembly according to claim 1 wherein said compliant member includes a stretchy membrane which extends across said opening in said bottom of said retainer and is squeezed against said retainer by said heat exchanger, and wherein said membrane has a hole with a perimeter that stretches around said face of said heat exchanger.

10. A mechanical assembly according to claim 1 wherein said compliant member includes a seal ring which extends around said opening in said bottom of said retainer, and wherein said seal ring surrounds said face of said heat exchanger and forms a seal with said heat exchanger.

11. A mechanical assembly according to claim 1 wherein said compliant member includes a stretchy membrane which has a hole with a perimeter that stretches around said face of said heat exchanger, and wherein adjacent to said hole, said stretchy membrane includes a sticky material that sticks to said heat exchanger.

12. A mechanical assembly according to claim 1 wherein said face of said heat exchanger consists of a first material which is wetted by a predetermined alloy; and, a portion of said heat exchanger which is adjacent to said face is coated with a second material which is not wetted by said predetermined alloy.

13. A mechanical assembly according to claim 12 wherein said seal extends completely around said face of said heat exchanger and is spaced therefrom on said coating.

14. A mechanical assembly according to claim 1 wherein said seal extends completely around said face of said heat exchanger and is adjacent thereto.

* * * * *